United States Patent [19]
Suzuki et al.

[11] Patent Number: 5,726,492
[45] Date of Patent: Mar. 10, 1998

[54] SEMICONDUCTOR MODULE INCLUDING VERTICALLY MOUNTED SEMICONDUCTOR CHIPS

[75] Inventors: Masahiro Suzuki; Haruhiko Yamamoto, both of Kawasaki, Japan

[73] Assignee: Fujitsu Limited, Kawasaki, Japan

[21] Appl. No.: 655,446

[22] Filed: May 30, 1996

[30] Foreign Application Priority Data

Oct. 27, 1995 [JP] Japan ................................. 7-280389

[51] Int. Cl.[6] .................................................. H01L 23/02
[52] U.S. Cl. ........................... 257/685; 257/686; 257/712; 257/723
[58] Field of Search ................................. 257/686, 723, 257/685, 712, 779

[56] References Cited

U.S. PATENT DOCUMENTS

| | | | |
|---|---|---|---|
| 5,016,138 | 5/1991 | Woodman | 257/686 |
| 5,313,096 | 5/1994 | Eide | 257/686 |

*Primary Examiner*—Tom Thomas
*Assistant Examiner*—Roy Potter
*Attorney, Agent, or Firm*—Staas & Halsey

[57] ABSTRACT

A semiconductor module includes a plurality of elementary chip assemblies stacked with each other, wherein each of the elementary chip assemblies includes a semiconductor chip and a thermally conductive substrate supporting the semiconductor chip thereon. The elementary chip assemblies are stacked in a manner such that the bottom edge of the semiconductor chips are aligned to form a bottom surface of the semiconductor module, and interconnection electrodes are provided on the bottom surface.

19 Claims, 13 Drawing Sheets

SEMICONDUCTOR MODULE INCLUDING VERTICALLY MOUNTED SEMICONDUCTOR CHIPS

BACKGROUND OF THE INVENTION

The present invention generally relates to semiconductor devices and more particularly to a module structure of semiconductor integrated circuits in which efficiency of cooling is improved.

With the requirement of increased mounting density of semiconductor chips, there is a demand for a module structure of semiconductor devices that can carry a large number of semiconductor chips and is still capable of providing efficient cooling of the chips.

For example, Japanese Laid-open Patent Publication 55-146953 corresponding to U.S. patent application Ser. No. 23,968 originally filed on Mar. 26, 1979, describes a module structure adapted for efficient cooling of chips, in which a plurality of thermally conductive wafers each carrying thereon a two-dimensional array of integrated circuit chips such as CPU, are stacked with each other to form a layered body, wherein a plurality of such layered bodies are disposed on a main substrate. The cooling is achieved by disposing conduits of coolant in the vicinity of the foregoing layered bodies, such that the heat generated by the integrated circuits is removed by the coolant flowing through the conduits.

In order to increase the mounting density further, there is a proposal to mount semiconductor chips including therein integrated circuits vertically rather than horizontally, on a main substrate or mother board as indicated in FIGS. 1A and 1B.

Referring to FIG. 1A showing a proposed mounting structure 11 in a side view, the mounting structure includes a plurality of semiconductor chips 12 having bump electrodes 13 on corresponding electrode pads (not shown). Thereby, each semiconductor chip is mounted upon a corresponding TAB lead 14 via the bump electrodes 13 to form an elementary chip structure, and a plurality of such elementary chip structures are assembled together to form a chip module 16 in which the foregoing plurality of elementary chip structures are bonded with each other by a resin layer 15.

It should be noted that the chip module 16 thus formed has a bottom surface in which the outer leads of the TAB lead 14 are exposed, and the semiconductor devices formed in the chips 12 are tested in the state of the chip module 16. After the testing, the chip module 16 is mounted upon a substrate 17 that carries thereon a wiring pattern 18, such that the outer leads of the TAB leads 14 are soldered to the wiring pattern 18 by a solder layer 19 for each of the elementary chip structure as indicated in an enlarged view of FIG. 1B.

In the chip module 16 of FIGS. 1A and 1B, the density of mounting the chips 12 is increased substantially as a result of vertical mounting of the chips 12. The chip module 16 is particularly suitable for mounting integrated circuits having relatively small number of pins such as memory chips.

On the other hand, recent tendency of increased mounting density of semiconductor devices raises the problem of increased heat generation also in the case of such memory chip modules. In the case of the chip module 16 where no effective heat dissipation path is provided for the chip 12, there is a tendency that the generated heat is accumulated in the module 16 and results in an increase in the chip temperature. Ultimately, the semiconductor devices in the chips 12 may be damaged.

SUMMARY OF THE INVENTION

Accordingly, it is a general object of the present invention to provide a novel and useful semiconductor device structure wherein the foregoing problems are eliminated.

Another and more specific object of the present invention is to provide a semiconductor module structure that achieves a large mounting density of semiconductor chips and is still capable of providing efficient cooling of the chips.

Another object of the present invention is to provide a semiconductor module structure for mounting upon a main substrate having a principal surface, said semiconductor module comprising:

a plurality of semiconductor chips; and a plurality of substrates each carrying thereon a wiring pattern and formed of a thermally conductive material, each of said semiconductor chips being mounted upon a corresponding substrate in electrical connection to said wiring pattern on said substrate to form an elementary chip assembly, said elementary chip assembly having an edge, said semiconductor module including a plurality of said elementary chip assemblies stacked with each other in a state that said edges are aligned, said edges thereby defining a bottom surface of said semiconductor module, said semiconductor module carrying, on said bottom surface, electrodes in electrical connection to said wiring patterns provided on said substrates, said electrodes thereby being adapted for contact with a conductor pattern provided on a main substrate on which said semiconductor module is mounted.

According to the present invention, a large mounting density is achieved for the semiconductor chips by stacking the semiconductor chips with each other in the form of the elementary chip assemblies. Even in such a state where the chips are mounted with a large mounting density, an efficient heat dissipation is guaranteed by the thermally conductive substrates on which the semiconductor chips are mounted. Thereby, the problem of the heat accumulated in the semiconductor module is eliminated, and the reliability of operation of the semiconductor devices in the chips is improved substantially.

Other objects and further features of the present invention will become apparent from the following detailed description when read in conjunction with the attached drawings.

DETAILED DESCRIPTION OF THE PREFERRED EMBODIMENTS

Figure 1A:
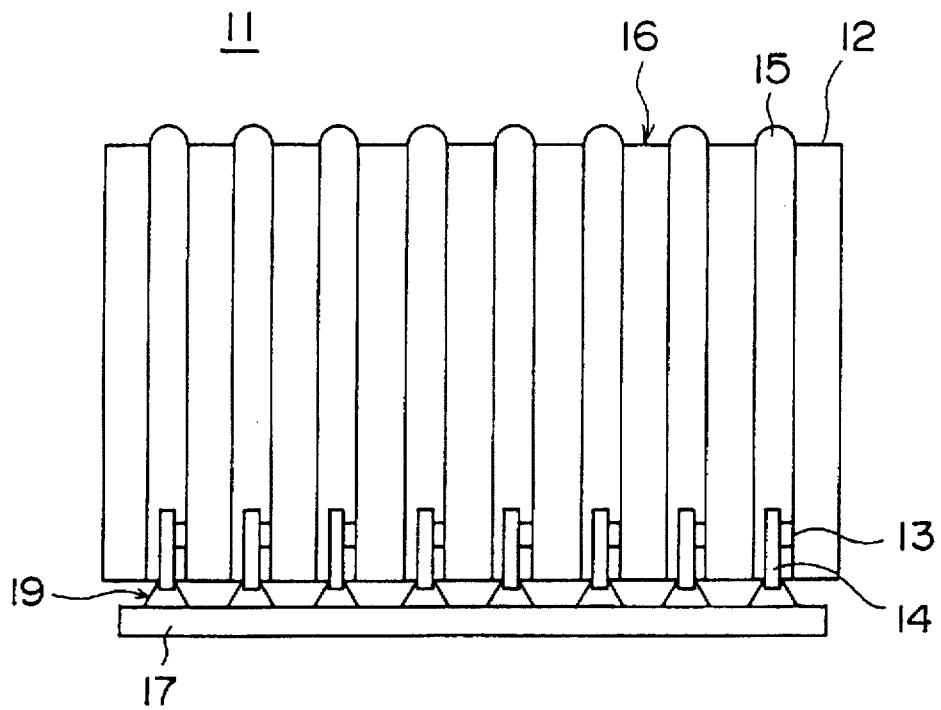
FIGS. 1A and 1B are diagrams showing the construction of a conventional semiconductor module.
Figure 1B:
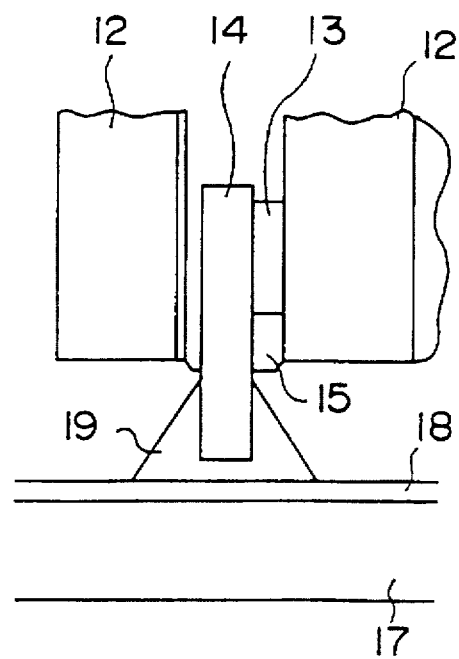
Figure 2A:
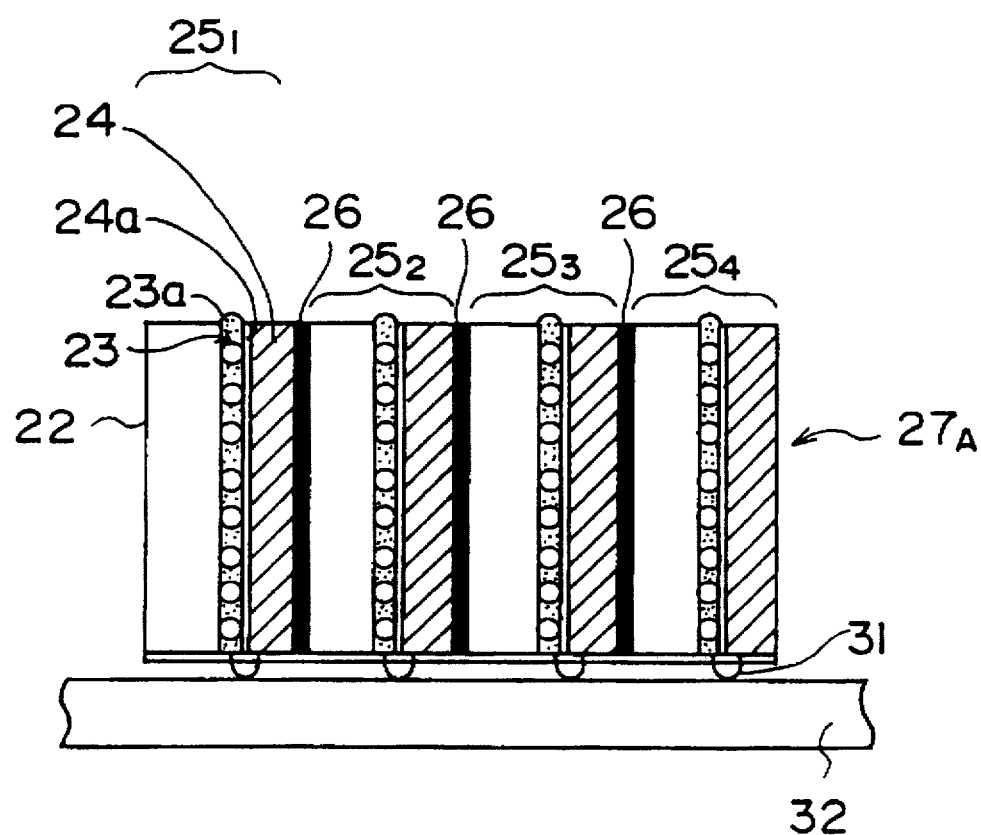
FIGS. 2A and 2B are diagrams showing the construction of the semiconductor module according to a first embodiment of the present invention.
Figure 2B:
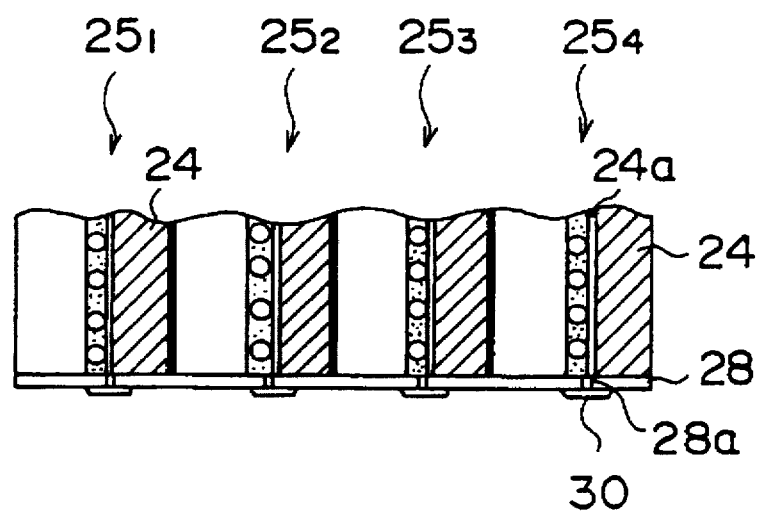

FIGS. 2A and 2B show an electronic apparatus 21A according to a first embodiment of the present invention, wherein FIG. 2A shows the electronic apparatus 21A in an elevational cross sectional view, while FIG. 2B shows a part of the same apparatus 21A in an enlarged cross sectional view.

Referring to FIG. 2A, the electronic apparatus 21A includes a number of semiconductor chips 22, each of which may be a memory semiconductor integrated circuit chip, such that the semiconductor chips 22 are mounted upon a main substrate or mother board 32.

More specifically, each of the semiconductor chips 22 carries thereon a number of solder bumps 23 and is mounted upon a corresponding substrate 24 that carries thereon a wiring pattern 24a, in a state that the solder bumps 23 are fused upon a corresponding part of the wiring pattern 24a. As usual, the solder bumps 23 may have a solder bump structure including stacking of Au and solder alloy layers. Alternatively, a silver paste may be used in place of the solder bumps 23.

As indicated in FIGS. 2A and 2B, the space formed between the semiconductor chip 22 and the substrate 24 is filled by a mold resin 23a, and the semiconductor chip 22 and the corresponding substrate 24 form together a chip assembly $25_1$.

It should be noted that there are formed a number of such chip assemblies $25_1$–$25_4$ as indicated in FIGS. 2A and 2B, wherein such chip assemblies $25_1$–$25_4$ are bonded with each other by an adhesive layer 26 to form a semiconductor module 27A. The semiconductor module 27A is mounted upon the main substrate 32 to form the electronic apparatus 21A.

Each of the substrates 24 is formed of a thermally conductive material such as AlN or SiC, wherein the wiring pattern 24a is formed by a photolithographic process of a conductor layer provided on the substrate 24. Alternatively, the substrate 24 may be formed of a metal such as Al or Cu covered by an insulating film. Further, a thermally conductive resin such as epoxy is used for the adhesive layer 26. Alternatively, a solder alloy may be used for the layer 26.

In the semiconductor module 27A, the semiconductor chips 22 are stacked in a vertical state with respect to the main substrate 32, wherein each semiconductor chip 22 has a bottom edge facing the principal surface of the main substrate 32. In other words, the bottom edges of the semiconductor chips 22 are aligned to form a flat, bottom surface of the semiconductor module 27A.

It should be noted that the bottom surface of the semiconductor module 27A is polished until the wiring patterns 24a on the substrates 24 are exposed for each of the chip assemblies $25_1$–$25_4$, and a protective layer 28 is provided on the bottom surface as indicated in FIG. 2B.

Typically, the protective layer 28 is formed and via-holes 28a are formed in the layer 28 in correspondence to the part of the wiring patterns 24a where an external contact is to be made. The via-holes 28a are filled by a conductive member such as W, and a terminal pad 30 is provided on each of the via holes 28a thus filled by the conductive member.

Thus, the terminal pads 30 are disposed on the bottom surface of the semiconductor module 27A, wherein the terminal pads 30 are repeated in the longitudinal direction of the semiconductor module 27A with a pitch corresponding to the thickness of the chip assemblies $25_1$–$25_6$. On the other hand, the distribution of the terminal pads 30 in the lateral direction of the module 27A is determined by the wiring pattern 24a on each of the substrates 24.

Each of the terminal pads 30 is further covered by a solder bump 31 formed of a material identical to the material of the solder bump 23, and the electronic apparatus 21A is formed by mounting the semiconductor module 27A upon a wiring pattern (not shown) provided on the principal surface of the main substrate or mother board 32. In this state, it will be noted that the semiconductor chips 22 are mounted vertically with respect to the main substrate 32.

Figure 3:
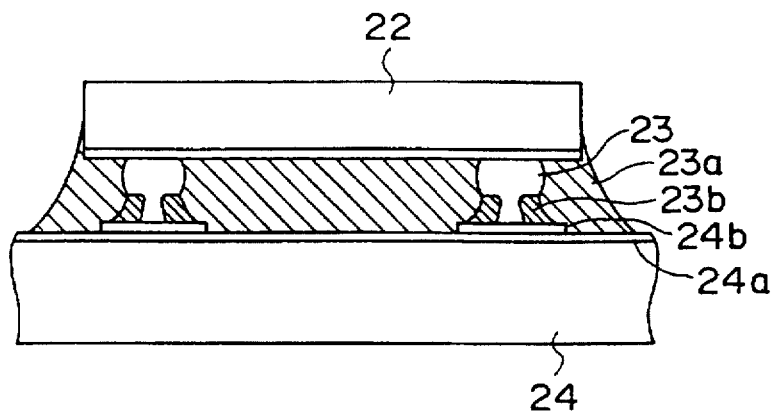
FIG. 3 shows the details of the semiconductor module of the first embodiment.

FIG. 3 shows the state of a semiconductor chip 22 mounted upon a corresponding substrate 24 in an enlarged scale.

Referring to FIG. 3, it will be noted that the solder bump 23 is formed on an electrode pad (not shown) on the chip 22, while the solder bump 23 thus formed is covered by a conductive adhesive layer 23b such as a silver paste. Thus, after proper positioning of the semiconductor chip 22 on the substrate 24 such that the bump electrodes 23 contact with corresponding lands 24b provided on the wiring pattern 24a on the substrate 24, the mold resin 23a is applied between the chip 22 and the substrate 24, followed by a curing of the mold resin 23a.

Figure 4:
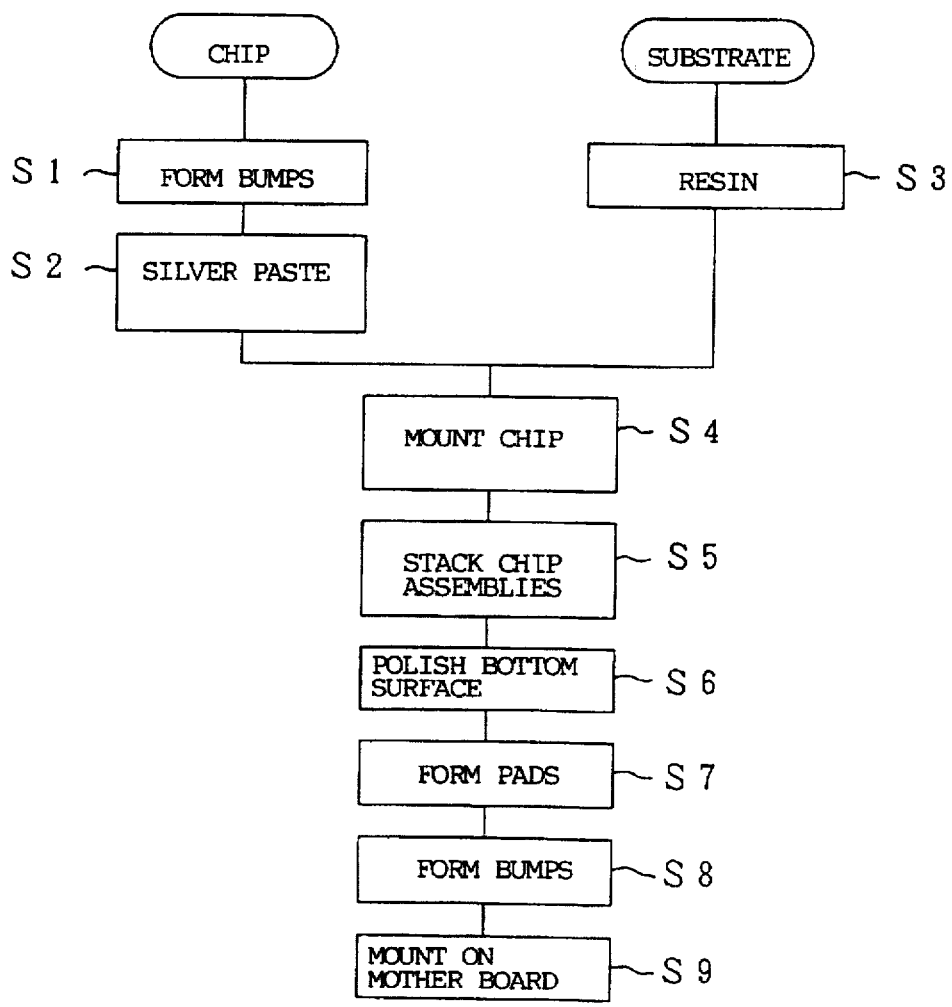
FIG. 4 is a flowchart explaining the process for assembling of the semiconductor module of the first embodiment and the process for mounting the semiconductor module on a main substrate.

FIG. 4 shows the process for forming the electronic apparatus 21A in the form of flowchart.

Referring to FIG. 4, a step S1 is conducted in which the solder bumps 23 are formed on the chip 22, followed by a step S2 for covering the solder bumps 23 by a silver paste to form the conductive adhesive layer 23b on the solder bumps 23.

Meanwhile, a step S3 is conducted, preferably concurrently to the foregoing steps S1 and S2, in which the mold resin 23a is applied on the wiring pattern 24a provided on the substrate 24.

Thus, after the steps S2 and S3 are completed, a step S4 is conducted in which the semiconductor chip 22 is mounted upon the corresponding substrate 24 by causing a fusion of the solder bumps 23 of the chip 22 upon the corresponding wiring pattern 24a on the substrate 24. In the step S4, the mold resin 23a is cured after a proper positioning of the chip 22 with respect to the wiring pattern 24a as mentioned above. As a result of the step S4, the chip assemblies $25_1$–$25_4$ are formed.

Next, in a step S5, the chip assemblies $25_1$–$25_4$ are stacked with each other with the adhesive layers 26 intervening therebetween such that the bottom edges of the chips 22 are aligned, to form the semiconductor module 27A.

Further, a step S6 is carried out in which the bottom surface of the semiconductor module 27A is polished until the wiring patterns 24a on the substrates 24 are exposed, and at step S7 the protective layer 28 is formed on the foregoing bottom surface of the semiconductor module 27A.

In the step S7, the protective layer 28 thus formed is further provided with contact holes in correspondence to the part of the wiring patterns 24a where external connections are to be made, and the terminal pads 30 shown in FIG. 2B are formed in correspondence to such contact holes in contact with the wiring patterns 24a.

After the terminal pads 30 are formed as such, a step S8 is conducted in which the solder bumps 31 are formed on the terminal pads 30. Thereby, the semiconductor module 27A carries the solder bumps 31 on the bottom surface thereof.

The semiconductor module 27A thus formed is then mounted upon the main substrate 32 in a step S9 such that the solder bumps 31 contact with the wiring patterns provided on the main substrate 32.

In the foregoing process of forming the electronic apparatus 21A, one may conduct a testing of the semiconductor module 27A in the step S8.

The electronic apparatus 21A thus formed has an advantageous feature that the heat generated by the semiconductor chip 22 is conducted to the corresponding substrate 24 via the solder bumps 23, wherein the heat thus reached the substrate 24 is further conducted to an adjacent substrate 24 via the adhesive layer 26. Ultimately, the heat is conducted to the main substrate 32 via the solder bumps 31. In other words, the semiconductor module structure 27A, while having the construction in which a number of semiconductor chips 22 are stacked with each other, is extremely efficient for dissipating heat generated by the chips 22 to the main substrate 32. Thereby, the reliability of the device operation is substantially improved.

In the semiconductor module 27A, it should be noted that the efficiency of heat dissipation may be reduced when the number of the solder bumps 23 or the solder bumps 31 is small. In such a case, one may secure sufficient heat dissipation by providing dummy solder bumps 23 and 31, in addition to the solder bumps 23 and 31 used actually for wiring, for reducing the heat resistance of the semiconductor module 27A. The dummy bumps 23 may be connected to nowhere or may be connected to a ground pattern on the wiring pattern 24a.

Figure 5A:
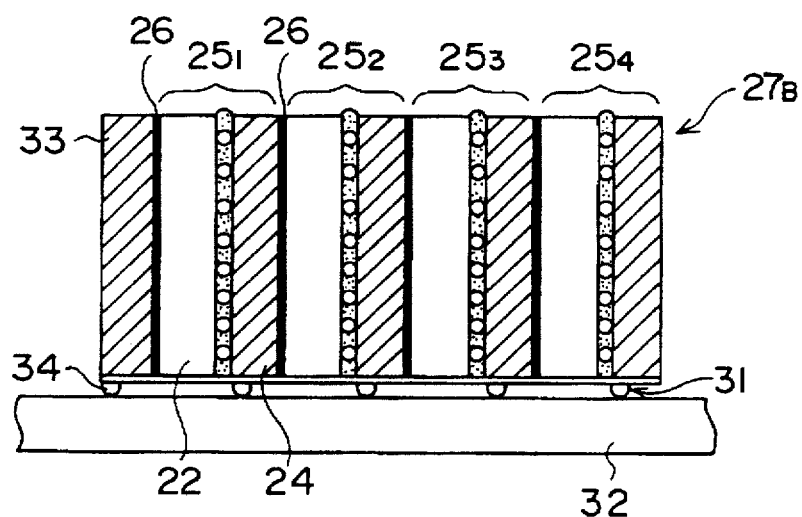
FIGS. 5A–5C are diagrams showing various modification of the semiconductor module of the first embodiment.

FIG. 5A shows a semiconductor module 27B according to a modification of the semiconductor module 27A.

Referring to FIG. 5A, the semiconductor module 27B has a structure identical to the structure of the semiconductor module 27A, except that a heat radiation member 33 is provided on the outermost semiconductor chip 22 via the adhesive layer 26. In order to facilitate heat dissipation to the main substrate 32, there is provided a dummy solder bump 34 in correspondence to the heat radiation member 33. Thereby, the dummy solder bump 34 does not contribute to any electrical interconnection.

Figure 5B:
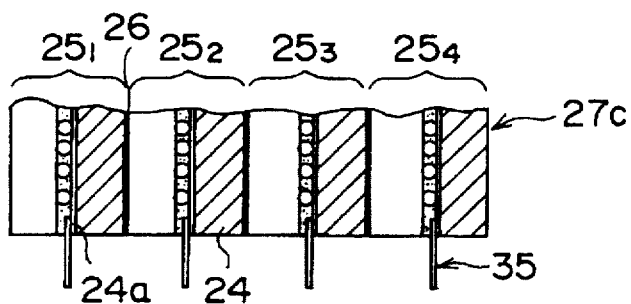

FIG. 5B shows a semiconductor module 27C according to another modification of the semiconductor module 27A. It should be noted that FIG. 5B shows only the bottom part of the semiconductor module 27C in an enlarged scale.

Referring to FIG. 5B, the semiconductor module 27C carries interconnection leads 35 on the bottom surface thereof in place of the solder bumps 31. In other words, the semiconductor module 27C forms a PGA structure in which the interconnection leads 35 are inserted into corresponding holes on the main substrate 32. In the case of the semiconductor module 27C, too, efficient heat dissipation occurs via the interconnection leads 35.

Similarly as before, one may provide dummy leads 35 in electrical connection to the ground pattern included in the wiring pattern 24a for enhancing the efficiency of heat dissipation. The semiconductor module 27C is also suitable for burn-in testing, as the interconnection leads allow detachable mounting upon a testing bed. Thus, when it is determined that the number of defective devices in the chips 22 is too large, the semiconductor module 27C is rejected before it is actually mounted upon the main substrate 32.

Figure 5C:
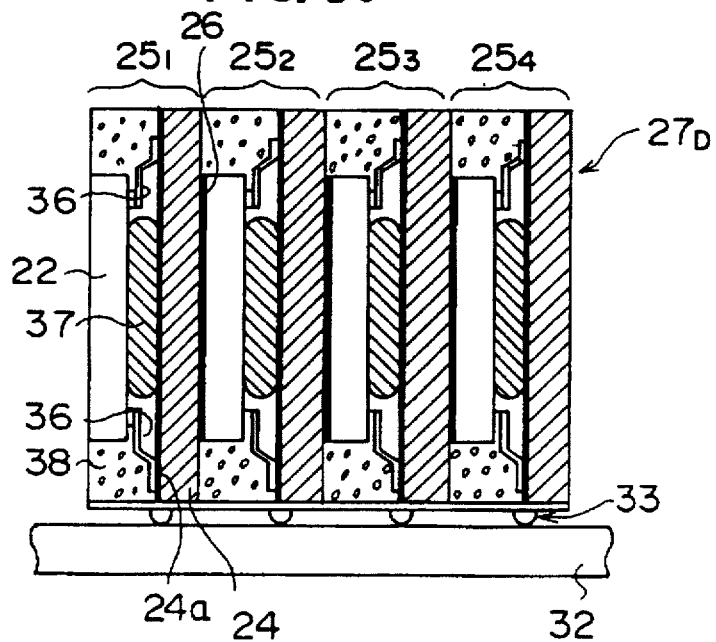

FIG. 5C shows a semiconductor module 27D according to other modification of the semiconductor module 27A.

Referring to FIG. 5C, each of the semiconductor chips 22 is mounted upon the corresponding substrate 24 via a TAB lead 36 in a face-down state. Thereby, in order to facilitate the removal of heat from the semiconductor chip 22 to the substrate 24, a thermally conductive member 37 such as a silicone compound or silicone sheet is interposed between the chip 22 and the substrate 24. Further, the semiconductor chips 22 are sealed upon the corresponding substrate 24 by a seal member 38 similar to the mold resin 23a.

The semiconductor chip assemblies $25_1$–$25_4$ thus formed are then stacked with each other via the intervening adhesive layers 26, and the semiconductor module 27D is formed as a result. Similarly as before, the semiconductor module 27D is formed with the solder bumps 33 on the bottom surface and is mounted upon the main substrate 32. In order to facilitate the heat dissipation, one may increase the number of the solder bumps 33 as already noted.

Figure 6:
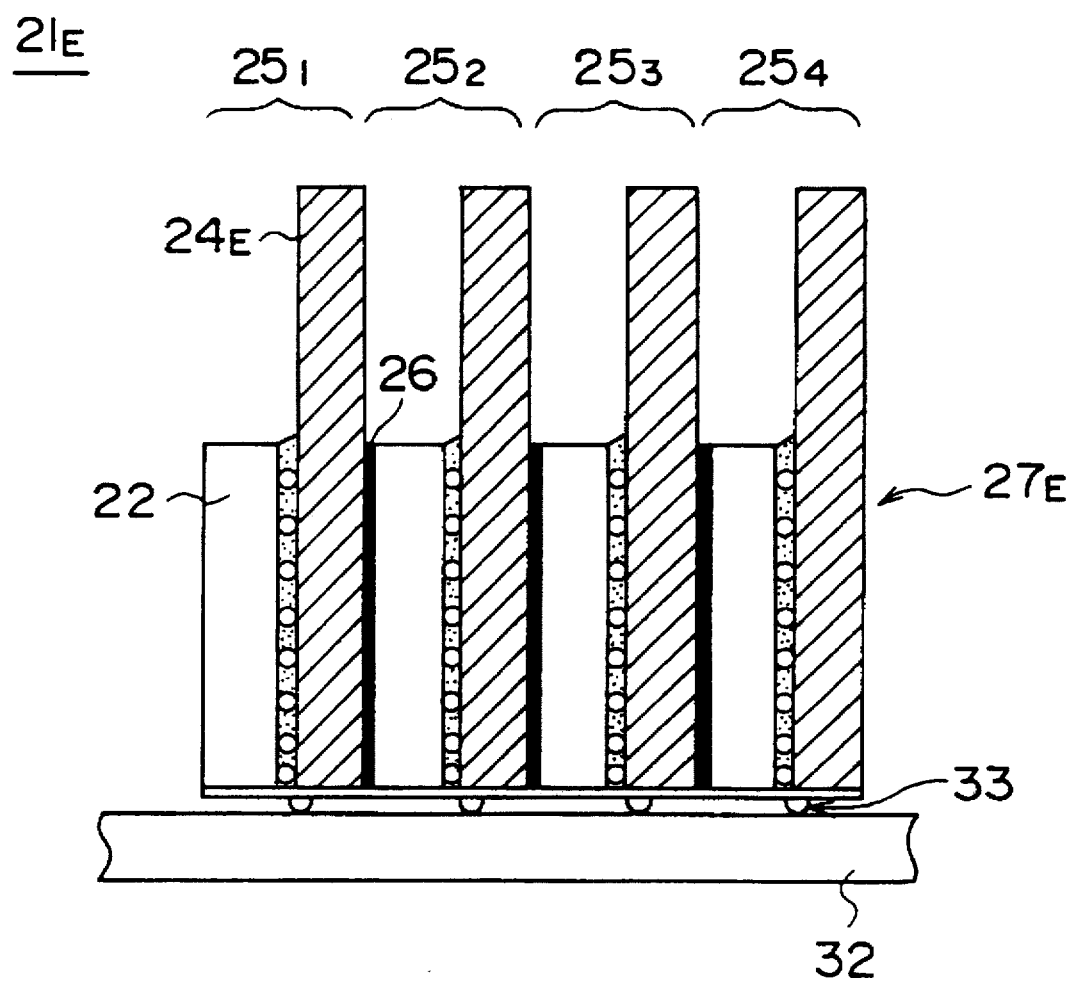
FIG. 6 is a diagram showing the construction of the semiconductor module according to a second embodiment of the present invention.

FIG. 6 shows the construction of a semiconductor module 27E according to a second embodiment of the present invention.

Referring to FIG. 6, it will be noted that each of substrates 24E on which a semiconductor chip 22 is mounted, has a size substantially larger than the size of the semiconductor chip 22 in each of the chip assemblies $25_1$–$25_4$. Thereby, the substrates 24E project outwardly from the semiconductor module 27E at the top surface thereof, and the projecting substrates 24E form a cooling fin structure of the semiconductor module 27E. When the chip 22 has a thickness of 0.4–0.6 mm and the substrate 24E has a thickness of 2.6 mm, the cooling fins are formed with a pitch of 3.0–3.6 mm.

By forming the cooling fins as such, the efficiency of heat radiation of the semiconductor module 27E is improved substantially. Further, such a structure having the cooling fins is suitable for forced air cooling.

Figure 7:
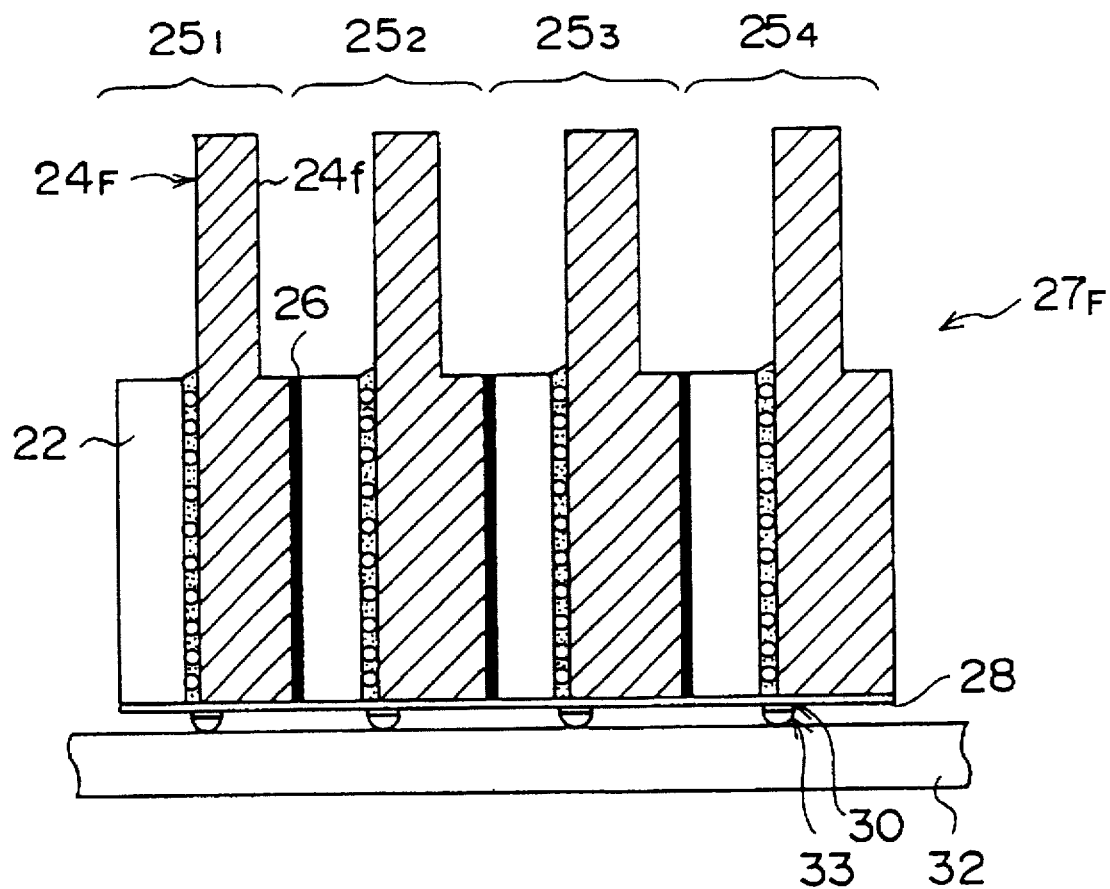
FIG. 7 is a diagram showing the construction of the semiconductor module according to a third embodiment of the present invention.

FIG. 7 shows a semiconductor module 27F according to a third embodiment of the present invention.

Referring to FIG. 7, each of the semiconductor chips 22 is mounted upon a corresponding substrate 24F to form a chip assembly such as $25_1$, wherein each of the substrates 24F has a fin part 24f of a reduced thickness outside the area where the semiconductor chip 22 is mounted. For example, the substrate 24F may have a thickness of 2.6 mm in the area on which the chip 22 is mounted and a reduced thickness of 1.6 mm outside the foregoing area having the thickness of 2.6 mm. In this case, the fins are formed with a pitch of 3.0–3.6 mm assuming that the chip 22 has a thickness of 0.4–0.6 mm.

According to the present embodiment, it is possible to optimize the semiconductor module 27F for maximum efficiency of cooling, by optimizing the thickness and pitch of the cooling fins 24f in accordance with the environmental condition such as wind velocity, air temperature, cooling air supply mode, and the like.

Figure 8:
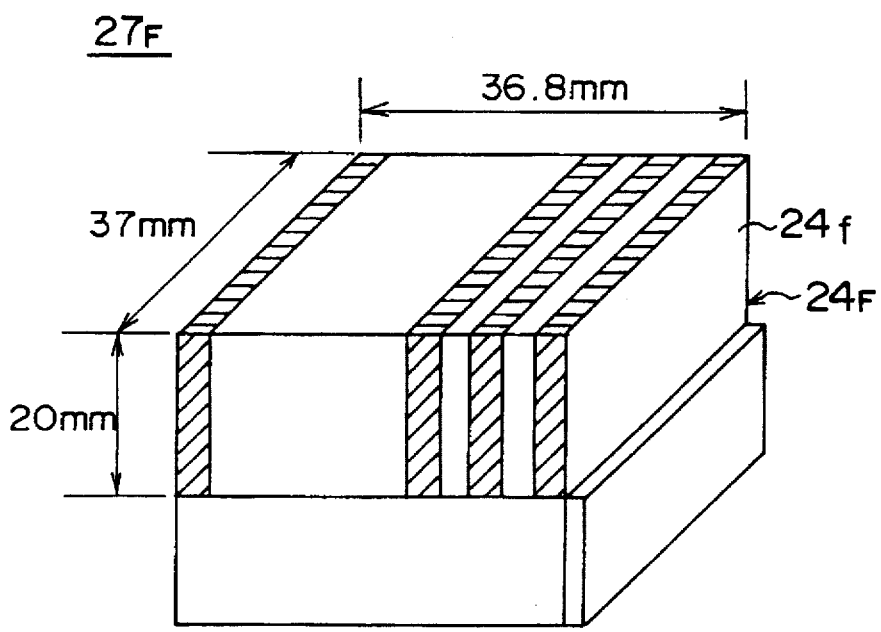
FIG. 8 is a diagram showing an optimization of the semiconductor module of the second embodiment with regard to cooling.
Figure 9:
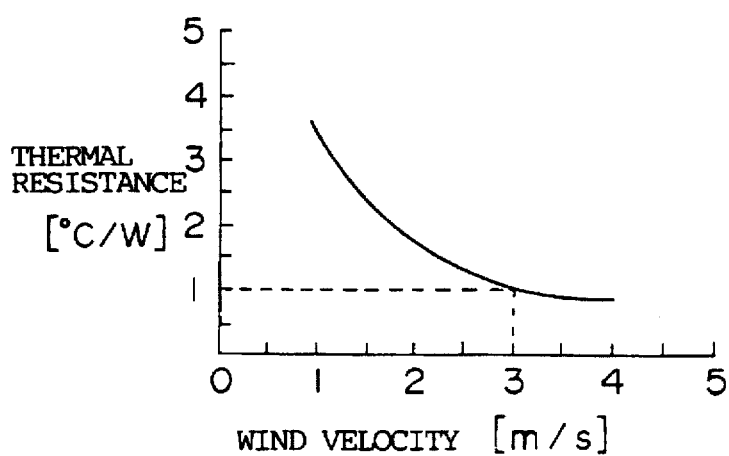
FIG. 9 is a diagram showing the efficiency of cooling for the optimized semiconductor module of FIG. 8.

FIG. 8 shows an example of the optimum cooling fin structure corresponding to the semiconductor module 27F of FIG. 7, while FIG. 9 shows the thermal resistance of the cooling fin structure of FIG. 8 as a function of the wind velocity.

Referring to FIG. 8, the cooling fins 24f, each having a thickness of 1.6 mm, are disposed with a pitch of 3.2 mm, such that the fin structure of the semiconductor module 27F has a total size of 36.8 mm in the direction of stacking of the chip assemblies. Further, the optimum fin structure has a height of 20 mm and a width of 37 mm as indicated in FIG. 8.

It should be noted that the relationship of FIG. 9 is obtained for an electronic apparatus in which the semiconductor module 27F having the construction of FIG. 8 is mounted upon the main substrate 32. From the relationship of FIG. 9, it will be noted that a thermal resistance of 1° C./W is achieved when the wind velocity is 3 m/s. This means that one can achieve a heat dissipation of as much as 20 W, provided that a temperature rise of 20° C. or more is tolerated.

Figure 10:
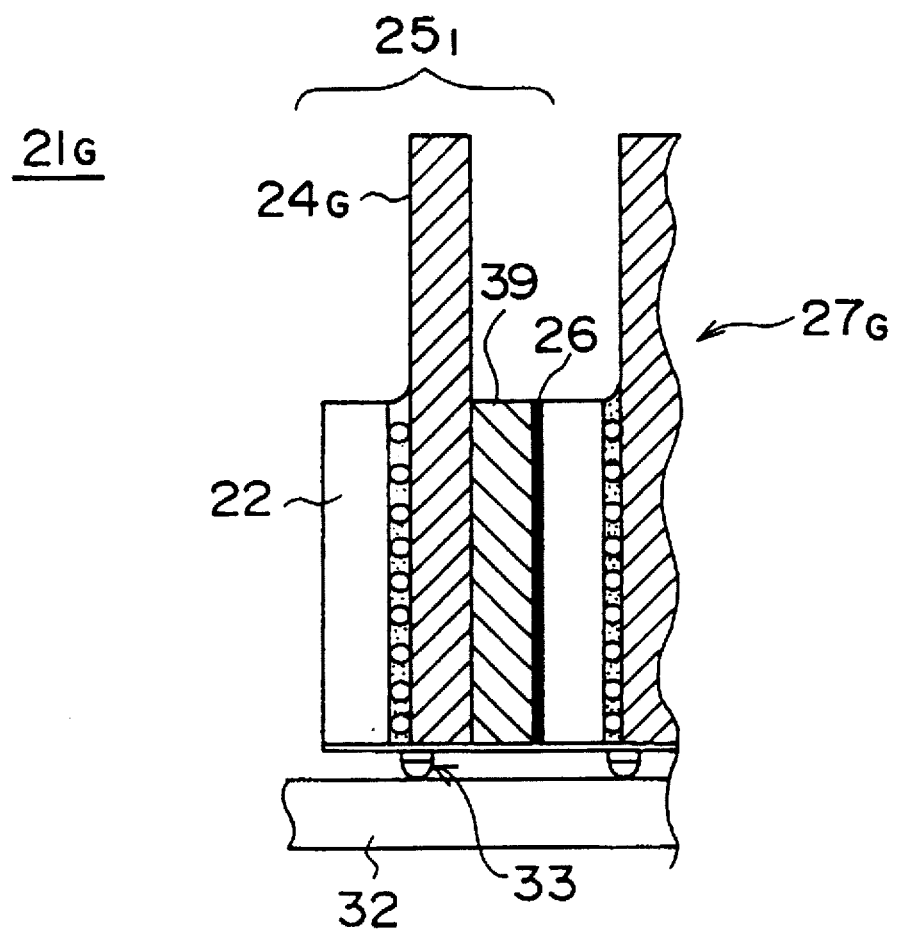
FIG. 10 is a diagram showing the semiconductor module according to a third embodiment of the present invention.

FIG. 10 shows a semiconductor module 27G corresponding to a modification of the semiconductor module 27F.

Referring to FIG. 10, the semiconductor module 27G uses a substrate 24G having a reduced thickness as compared with the substrate 24F. For example, the substrate 24G has a thickness of 1.6 mm, while this thickness is substantially smaller than the thickness of 2.6 mm of the substrate 24F. In the semiconductor module 27G, a spacer 39 is provided on the substrate 24G in correspondence to an area opposite to the area on which the chip 22 is mounted, for compensating for the reduced thickness of the substrate 24G. Thus, the spacer 39 may have a thickness of 1 mm. Thereby, a chip assembly, such as the chip assembly $25_1$, includes the spacer 39 in addition to the chip 22 and the substrate 24G.

The semiconductor module 27G is formed by stacking the chip assemblies similarly as before, in which the spacer 39 of a chip assembly is bonded to the chip 22 of an adjacent chip assembly by the adhesive layer 26. Preferably, the spacer 39 has a thermal conductivity comparable to that of the substrate 24G. It should be noted that the semiconductor module 27G is much easier to fabricate as compared with the semiconductor module 27F in which the thickness of the substrate 24F changes.

Figure 11:
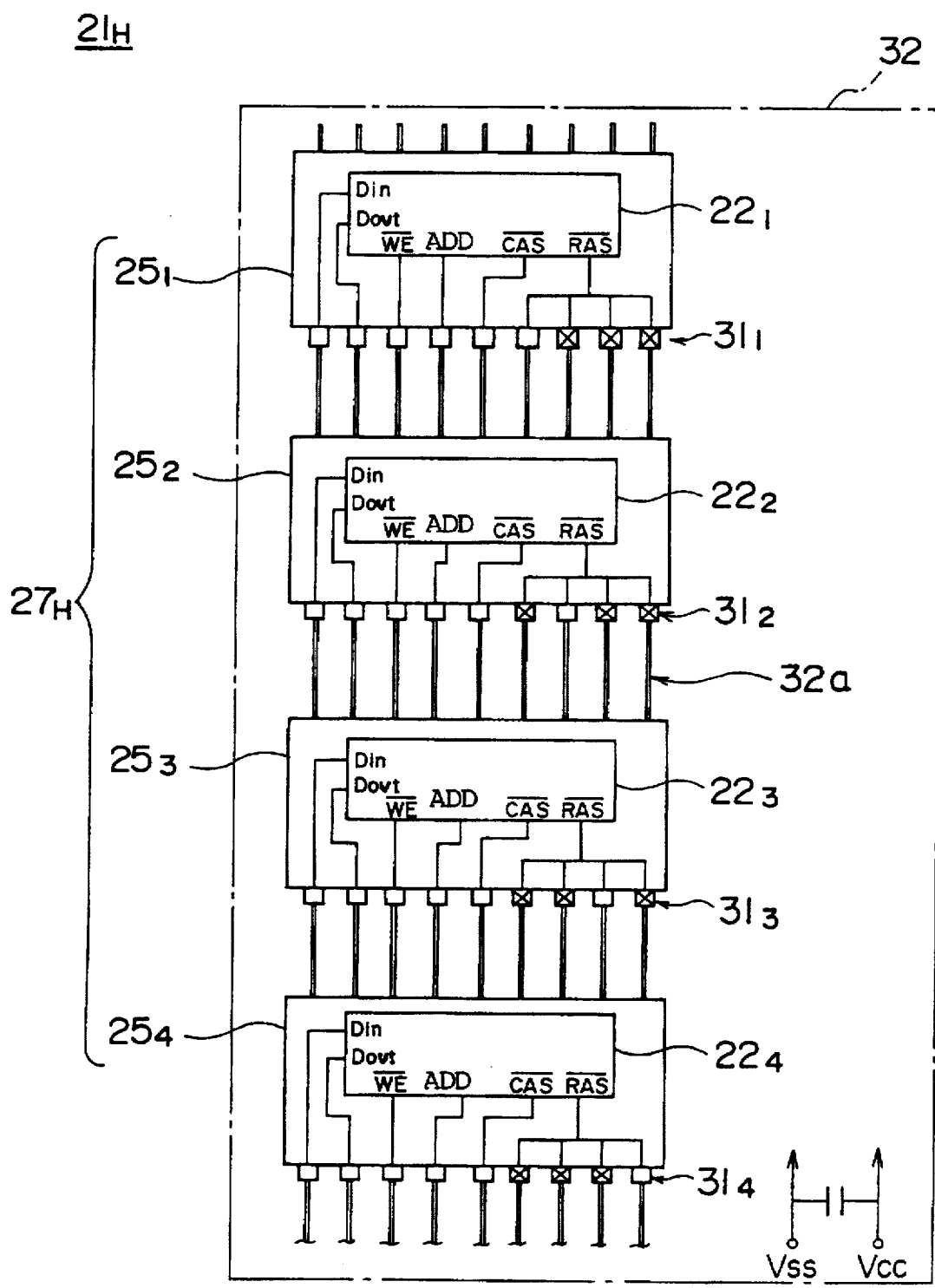
FIG. 11 is a diagram showing the semiconductor module according to a fourth embodiment of the present invention.

FIG. 11 shows the construction of an electronic apparatus 21H according to a fourth embodiment in a plan view.

Referring to FIG. 11, the electronic apparatus 21H uses any of the semiconductor modules 27A–27G described heretofore, wherein the semiconductor module used in the embodiment of FIG. 11 is represented by a numeral 27H.

In FIG. 11, it will be noted that the main substrate 32 of the electronic apparatus 21H carries thereon a wiring pattern 32a, and each of the chip assemblies $25_1$–$25_4$ of the semiconductor module 27H is mounted vertically on the main substrate 32 in electrical connection to the wiring pattern 32a. In one example, the respective chip assemblies $25_1$–$25_4$ include memory chips $22_1$–$22_4$ each having a storage capacity of 1 Mb. In this case where four such memory chips are assembled, the semiconductor module 27H forms a 4 Mb memory module.

It should be noted that the wiring pattern 32a on the main substrate 32 includes the patterns corresponding to various terminals on the chips $22_1$–$22_4$, wherein such terminals include a terminal for /RAS (row address strobe) data for word line selection, a terminal for /CAS (column address strobe) data for column decoder selection, power terminals for Vcc and Vss voltages for device powering, data terminals Din and Dout for data-in and data-out, and a control terminal for write-enable control data /WE. Further, there is a terminal for address data ADD, wherein the address data specifies a specific address. Thereby, the foregoing data /CAS, Din, Dout, /WE, ADD, Vcc and Vss are provided on the patterns 32a extending commonly to the chip assemblies $25_1$–$25_4$. On the other hand, the data /RAS is supplied to a selected pattern 32a extending to a selected chip assembly.

In operation, therefore, writing of data is made into a specific address of a selected chip such as the chip $22_1$ by supplying the address data ADD, the write enable control data WE, the write data Din, and the /CAS data, commonly to the chips $22_1$–$22_4$ via the respective corresponding patterns 32a on the main substrate 32, together with the /RAS data, wherein the /RAS data is supplied selectively to the selected chip $22_1$ via a selected pattern on the substrate 32. The reading of data is made, on the other hand, by selecting the chip $22_1$ by supplying the RAS data to the selected pattern that leads to the chip $22_1$.

Thus, reading and writing of data is achieved to and from a selected chip in the electronic apparatus 21H of FIG. 11 by selecting the conductor pattern for the /RAS data. In FIG. 11, it will be noted that the "x" marks provided for the terminals for the /RAS data indicate that the connection is interrupted. Thus, the chip $22_1$ is activated only when the /RAS data is supplied to the conductor pattern that leads to the /RAS terminal located at the left end of the four /RAS terminals of the chip $22_1$. Similarly, the chip $22_4$ is selected only when the /RAS data is supplied to the /RAS terminal provided at the right end of the four /RAS terminals of the chip $22_4$.

Thus, in the semiconductor module 21H of FIG. 11, the selection of the memory cell is achieved identically in each of the chips $22_1$–$22_4$, once the chip is selected by supplying the /RAS data to the selected chip.

Figure 12:
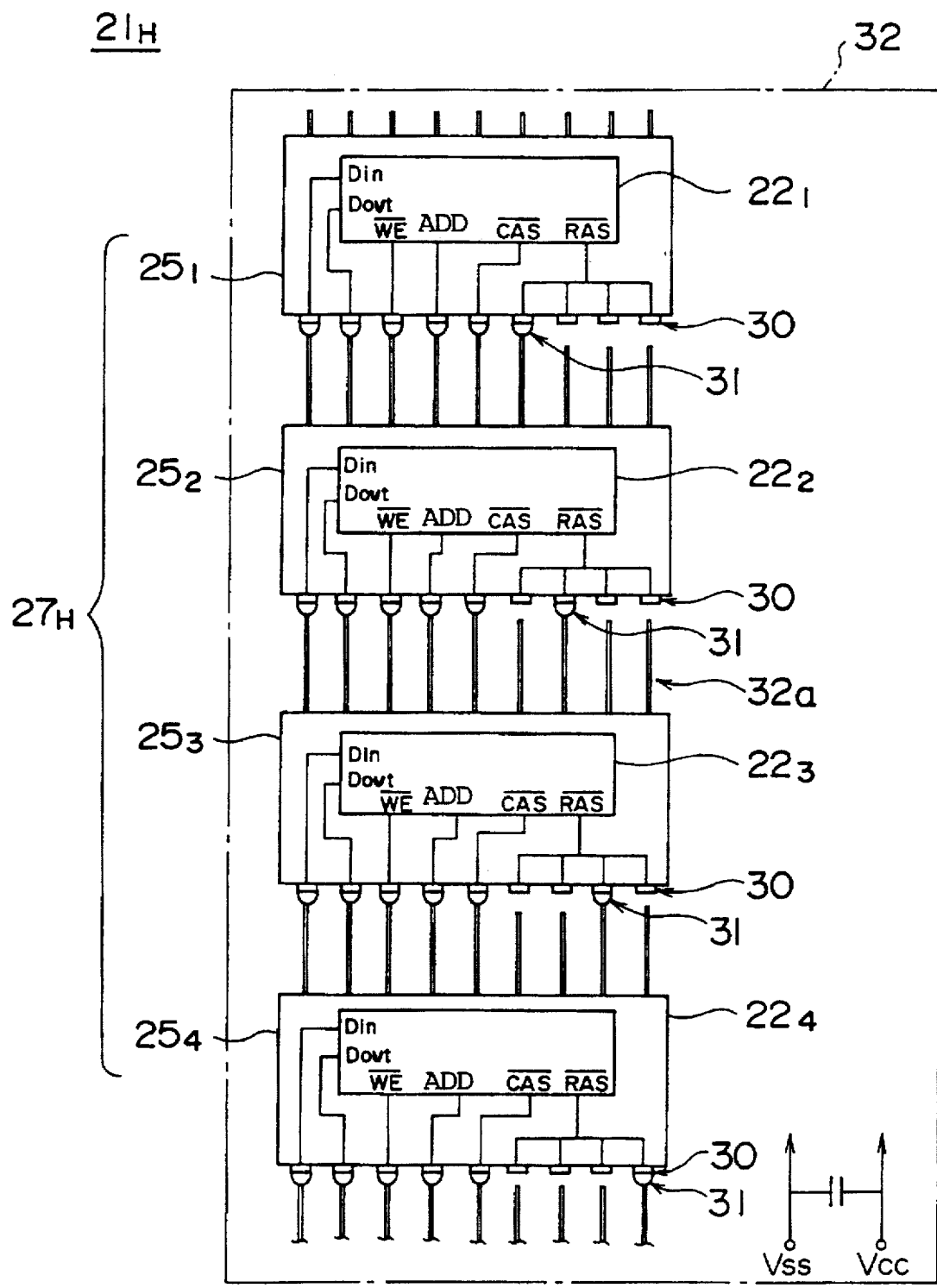
FIGS. 12–14 are diagrams showing various modes for mounting the semiconductor module of the third embodiment.

FIG. 12 shows the actual construction for realizing the electronic apparatus 21H of FIG. 11. In the example of FIG. 12, it will be noted that the conductor patterns extending to the /RAS terminals are disconnected except for one in each of the chips $22_1$–$22_4$.

Figure 13:
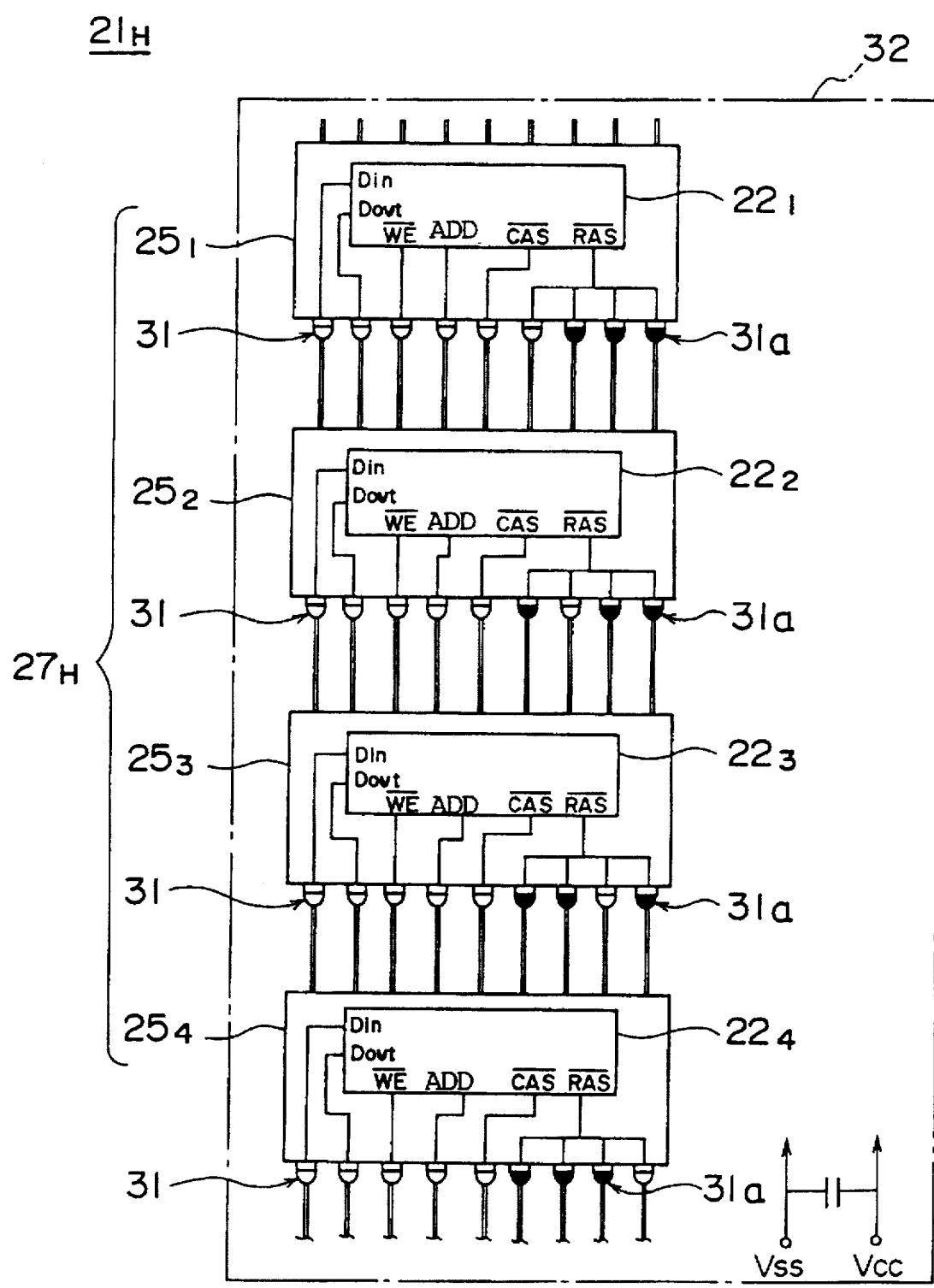

FIG. 13 shows another construction for realizing the electronic apparatus 21H of FIG. 11. In the example of FIG. 13, it will be noted that the /RAS terminals are covered by an insulating bump 31a except for one, proper /RAS terminal in each of the chips $22_1$–$22_4$. By providing the insulating bumps 31a on the remaining improper /RAS terminals, the problem of accidental connection of the /RAS leads to such improper /RAS terminals is positively eliminated, and a reliable selection of the chips becomes possible.

Figure 14:
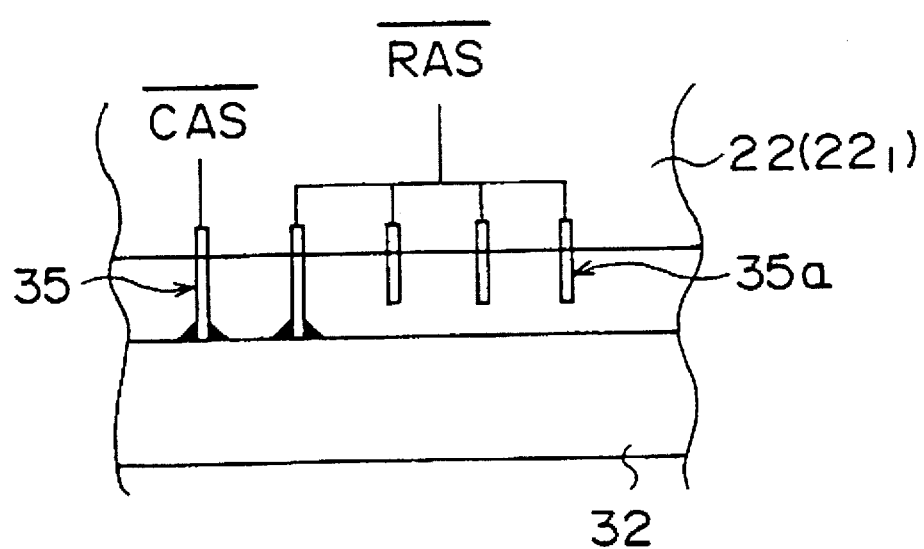

FIG. 14 shows a still other construction of the electronic apparatus 21H of FIG. 11.

In the example of FIG. 14, it will be noted that each of the chip assemblies $25_1$–$25_4$ of the semiconductor module 27H is mounted upon the main substrate 32 by way of interconnection leads 35. Thereby, in order to prevent the /RAS data to be supplied to improper /RAS terminal leads 35a, the present embodiment cuts the interconnection leads 35a for improper /RAS terminal leads except for one proper /RAS terminal. Thereby, only the proper /RAS terminal lead is connected to the conductor pattern on the main substrate as indicated in FIG. 14.

Figure 15:
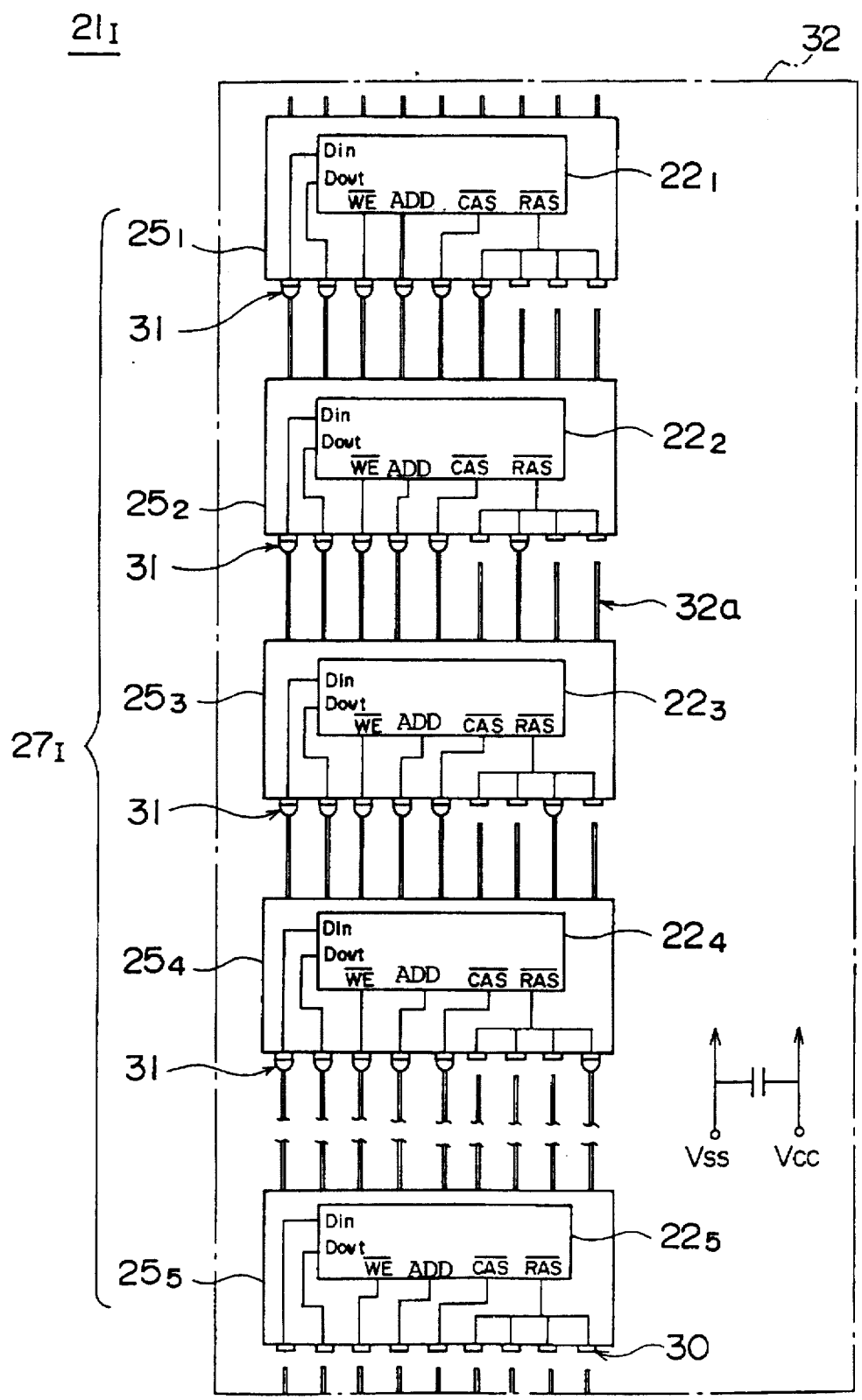
FIG. 15 is a diagram showing a modification of the fourth embodiment of the present invention.

FIG. 15 shows an electronic apparatus 21I according to a further modification of the electronic apparatus 21H of FIG. 11, wherein those parts described previously are designated by the same reference numerals and the description thereof will be omitted.

Referring to FIG. 15, the electronic apparatus 21I includes, in addition to the chip assemblies $25_1$–$25_4$ in the semiconductor module 27I, another, redundant chip assembly $25_5$, which in turn includes therein a semiconductor chip $22_5$. In the semiconductor module 27I, each of the memory chips $22_1$–$22_5$ is tested in the state that the solder bumps 31 are not yet formed. When the memory chips $22_1$–$22_4$ are determined to be free from defects, the solder bumps 31 are provided on the memory chips $22_1$–$22_4$ similarly as in the case of FIG. 11, while no solder bumps are provided on the memory chip $22_5$. Thus, while the semiconductor module 27I includes the semiconductor chip $22_5$ therein, no electrical connection is made to the chip $22_5$ when the semiconductor module 27I is mounted upon the main substrate 32.

On the other hand, when a defect is detected in any of the semiconductor chips $22_1$–$22_4$, the formation of the solder bumps 31 is prohibited on the defective chip. In such a case, the solder bumps 31 are provided on the redundant chip $22_5$, and the redundant chip $22_5$ is thus connected to the wiring pattern 32a on the main substrate 32 together with the defect-free memory chips that form the semiconductor module 27I, when the semiconductor module 27I is mounted upon the main substrate 32 to form the electronic apparatus 21I. Thereby, it is possible to save the electronic apparatus even when the semiconductor chips in the semiconductor module 27I contain defects.

Thus, according to the present invention, one can realize a high mounting density for the semiconductor chips in an electronic apparatus, while simultaneously securing efficient cooling path. Thereby, the reliability of the electronic apparatus is increased substantially.

Further, the present invention is not limited to the embodiments described heretofore, but various variations and modifications may be made without departing from the scope of the present invention.

What is claimed is:

1. A semiconductor module for mounting upon a main substrate having a conductor pattern, said semiconductor module comprising:

a plurality of semiconductor chips; and a plurality of substrates each carrying thereon a wiring pattern and formed of a thermally conductive material having a high thermal conductivity, each of said semiconductor chips being mounted upon a corresponding substrate in electrical connection to said wiring pattern on said corresponding substrate to form an elementary chip assembly, said elementary chip assembly having an edge, said semiconductor module including a plurality of said elementary chip assemblies stacked with each other in a state that said edges are aligned, said edges thereby defining a bottom surface of said semiconductor module, said semiconductor module carrying, on said bottom surface, electrodes in electrical connection to said wiring patterns provided on said substrates, said electrodes thereby being adapted for contact with a conductor pattern provided on said main substrate, said semiconductor module having an outermost substrate of said plurality of substrates, which is exposed to act as a heat sink.

2. A semiconductor module as claimed in claim 1, wherein said semiconductor module carrying, on a surface thereof defined by a principal surface of one of said semiconductor chips, a heat radiating structure.

3. A semiconductor module as claimed in claim 1, wherein each of said substrates having a size substantially larger than a size of said semiconductor chip provided thereon, each of said plurality of substrates including an exposed part not covered by said semiconductor chip, said exposed part of said substrate thereby forming a cooling fin, such that said cooling fin is separated from an adjacent cooling fin having an identical construction, by a distance corresponding to a thickness of said semiconductor chip.

4. A semiconductor module as claimed in claim 3, wherein said cooling fin has a thickness smaller than a thickness of a part of said substrate on which said semiconductor chip is provided.

5. A semiconductor module as claimed in claim 1, wherein each of said elementary chip assembly carries a predetermined number of electrodes on said edge.

6. A semiconductor module as claimed in claim 1, wherein said semiconductor chip is mounted upon said substrate, in each of said elementary chip assembly, by means of solder bumps, such that said solder bumps are fused to said wiring pattern on said substrate.

7. A semiconductor module as claimed in claim 6, wherein said solder bumps are provided with a number exceeding a number needed for said solder bumps to achieve electrical connection between said semiconductor chip and said substrate.

8. A semiconductor module as claimed in claim 1, wherein said semiconductor chip is mounted upon said substrate, in each of said elementary chip assembly, by means of a tape lead, such said tape lead connects said semiconductor chip to said wiring pattern on said substrate electrically.

9. A semiconductor module as claimed in claim 8, wherein a thermally conducting block is interposed between said semiconductor chip and said substrate in each of said elementary chip assembly.

10. A semiconductor module as claimed in claim 1, wherein said semiconductor module carries said electrodes on said bottom surface of said semiconductor module in the form of solder bumps.

11. A semiconductor module as claimed in claim 10, wherein said solder bumps are provided with a number exceeding a number of said solder bumps needed for achieving electrical connection between said semiconductor module and said main substrate.

12. A semiconductor module as claimed in claim 1, wherein said semiconductor module carries said electrodes on said bottom surface of said semiconductor module in the form of interconnection leads.

13. A semiconductor module as claimed in claim 1, wherein said semiconductor chips include a memory chip.

14. An electronic apparatus, comprising:

a mother board carrying thereon an interconnection pattern; and a semiconductor module mounted upon said mother board in electrical connection with said interconnection pattern, said semiconductor module comprising:

a plurality of semiconductor chips; and a plurality of substrates each carrying thereon a wiring pattern and formed of a thermally conductive material having a high thermal conductivity, each of said semiconductor chips being mounted upon a corresponding substrate in electrical connection to said wiring pattern on said corresponding substrate to form an elementary chip assembly, said elementary chip assembly having an edge, said semiconductor module including a plurality of said elementary chip assemblies stacked with each other in a state that said edges are aligned, said edges thereby defining a bottom surface of said semiconductor module, said semiconductor module carrying, on said bottom surface, electrodes in electrical connection to said wiring patterns provided on said substrates, said electrodes thereby being adapted for contact with said interconnection pattern provided on said mother board, said semiconductor module having an outermost substrate of said plurality of substrates, which is exposed to act as a heat sink.

15. An electronic apparatus as claimed in claim 14, wherein said interconnection pattern includes a first group pattern provided commonly for each of said elementary chip assemblies forming said semiconductor module and a second group pattern, said second group pattern including plural patterns each connected to one of said elementary chip assemblies.

16. An electronic apparatus as claimed in claim 15, wherein, in each of said elementary chip assemblies, said electrodes include a plurality of terminal electrodes such that said plurality of terminal electrodes are connected commonly to each other, said plurality of terminal electrodes corresponding to said plural patterns forming said second group pattern and being covered by an insulating coating except for one of said terminal electrodes.

17. An electronic apparatus as claimed in claim 15, wherein, in each of said elementary chip assemblies, said electrodes include a plurality of terminal electrodes such that said plurality of terminal electrodes are connected commonly to each other, said plurality of terminal electrodes corresponding to said plural patterns forming said second group pattern, wherein said plural patterns forming said second group pattern are disconnected from said corresponding terminal electrodes, except for one that is connected to a corresponding terminal electrode.

18. An electronic apparatus as claimed in claim 15, wherein said semiconductor modules includes a redundant elementary chip assembly in which said second group pattern is not connected thereto.

19. An electronic apparatus as claimed in claim 14, wherein said semiconductor chips include a memory chip.

* * * * *

UNITED STATES PATENT AND TRADEMARK OFFICE
CERTIFICATE OF CORRECTION

PATENT NO. : 5,726,492
DATED : Mar. 10, 1998
INVENTOR(S) : SUZUKI et al.

It is certified that error appears in the above-identified patent and that said Letters Patent is hereby corrected as shown below:

Col. 9, line 60 (Claim 1, last line), after "sink" insert --, the outermost substrate carrying a wiring pattern, and being mounted with a semiconductor chip--.

Col. 11, line 11 (Claim 14, last line), after "sink" insert --, the outermost substrate carrying a wiring pattern, and being mounted with a semiconductor chip--.

Signed and Sealed this

Fourteenth Day of July, 1998

*Attest:*

BRUCE LEHMAN

*Attesting Officer*         *Commissioner of Patents and Trademarks*